United States Patent [19]
Elango et al.

[11] Patent Number: 5,945,877
[45] Date of Patent: Aug. 31, 1999

[54] POWER AMPLIFIER WITH BOOTSTRAP VOLTAGE CLAMP

[75] Inventors: PakriSwami Elango; Gee-Heng Loh, both of Singapore, Singapore

[73] Assignee: SGS-Thomas Microelectronics Pte. Ltd., Singapore

[21] Appl. No.: 08/794,365

[22] Filed: Feb. 4, 1997

[30] Foreign Application Priority Data

Feb. 8, 1996 [FR] France .................................. 96 01766

[51] Int. Cl.$^6$ ........................................................ H03F 1/52
[52] U.S. Cl. ............................................ 330/156; 330/298
[58] Field of Search ........................ 330/51, 156, 207 P, 330/298; 327/315, 316, 323, 327, 328, 589

[56] References Cited

U.S. PATENT DOCUMENTS

| | | | |
|---|---|---|---|
| 3,819,952 | 6/1974 | Enomoto et al. | 307/202 |
| 4,268,796 | 5/1981 | Palara | 330/156 X |
| 4,751,473 | 6/1988 | Ono | 330/277 |
| 5,315,263 | 5/1994 | Mudra et al. | 330/156 |
| 5,526,214 | 6/1996 | Takata et al. | 330/298 X |

OTHER PUBLICATIONS

French Search Report from French Patent Application No. 96 01766, filed Feb. 8, 1996.

IEEE Transactions on Consumer Electronics, vol. 38, No. 3, Aug. 1, 1992, pp. 217–222, Brasca G., et a., "A 100V/100W Monolithic Power Audio Amplifier in Mixed Bipolar–MOS Technology".

*Primary Examiner*—Steven J. Mottola
*Attorney, Agent, or Firm*—Wolf, Greenfield & Sacks, P.C.

[57] ABSTRACT

An amplifier output stage having an output transistor connected to a high supply voltage and a bootstrap terminal coupled to a control terminal of the output transistor through control circuitry. The output stage includes a capacitor arranged between the bootstrap terminal and the output terminal of the output stage for elevating the voltage at the bootstrap terminal above the high supply voltage, and circuitry for limiting the voltage at the bootstrap terminal to a predetermined threshold. The circuitry for limiting the voltage at the bootstrap terminal directly acts on the control terminal of the output transistor to reduce the conductivity of the output transistor when the voltage at the bootstrap terminal exceeds the predetermined threshold.

15 Claims, 2 Drawing Sheets

POWER AMPLIFIER WITH BOOTSTRAP VOLTAGE CLAMP

BACKGROUND OF THE INVENTION

1. Field of the Invention

The present invention relates to a power amplifier of the type including a bootstrap capacitor. More particularly, the present invention relates to a circuit for clamping the bootstrap voltage of the bootstrap capacitor in an output stage of the power amplifier so that this voltage does not reach or exceed the breakdown voltage of transistors of the output stage.

2. Discussion of the Related Art

FIG. 1A partially shows a bootstrapped output stage of a conventional amplifier including a bootstrap capacitor. A bootstrap capacitor is frequently used in audio amplifiers to force full conduction of the high-side transistor of the output stage of the amplifier in order to deliver maximum power to the load with lower energy dissipation in the amplifier. Amplifier 1 has a positive supply terminal 2 and a negative supply terminal 3 which are respectively connected to a positive supply line +Vcc and to a negative supply line −Vcc (or ground). The output stage includes a high-side transistor M1 and a low-side transistor M2, for example N-channel MOS transistors, connected in series between terminals 2 and 3. The gate of transistor M1 is coupled to a bootstrap terminal 5 through a current source 4. The source of transistor M1, connected to the drain of transistor M2, constitutes the output terminal 6 of the amplifier 1.

The gate of transistor M1 is connected to supply line −Vcc through a series connection of two N-channel MOS transistors M3 and M4. Transistor M3 is diode-connected and transistor M4 is controlled by the drive voltage Vin provided to the output stage. The gate of transistor M2 is connected to the output of an operational amplifier 7. The inverting input of amplifier 7 is connected to terminal 6, and the non-inverting input is connected to the node N between transistors M3 and M4. With this construction, amplifier 7 drives transistor M2 such that the voltage at terminal 6 equals the voltage at node N. Transistors M1 and M3 act as a current mirror, wherein transistor M1 replicates the current of source 4 with an amplification factor depending on the W/L ratios of transistors M1 and M3.

An external bootstrap capacitor C having a high capacitance value is connected between terminals 5 and 6. This bootstrap capacitor C serves to provide the high-side transistor M1 with enough gate voltage Vg, so that the output voltage may reach the supply voltage +Vcc in any load conditions. Terminal 5 is coupled to line +Vcc through a diode D1 and an NPN transistor Q1. The base of transistor Q1 is coupled to line +Vcc through a current source 8 and to terminal 6 through a Zener diode DZ1.

FIG. 1B illustrates the operation of the bootstrapped output stage of FIG. 1A. The output voltage, at terminal 6, is shown at maximum swing, i.e., it varies between the two supply voltages −Vcc and +Vcc. When the output voltage 6 reaches its lowest value −Vcc (transistor M1 is off and transistor M2 is on), capacitor C charges substantially up to the Zener voltage Vz1 of diode DZ1 through diode D1 and transistors Q1 and M2. Zener voltage Vz1, which substantially corresponds to the maximum gatesource voltage of transistor M1, is chosen such that transistor M1 is suitably driven in full load conditions.

When the output voltage 6 reaches its highest value +Vcc (transistor M1 is on and transistor M2 is off), the bootstrap voltage 5 is equal to the output voltage (+Vcc), plus the voltage across capacitor C. Since capacitor C has a high value of capacitance and hardly discharges, the bootstrap voltage 5 reaches a value substantially equal to +Vcc +Vz1.

As shown by hatched areas, the gate voltage Vg of transistor M1 varies between the output voltage 6 and the bootstrap voltage 5, depending on the load conditions. For example, in full load conditions, the gate voltage Vg may be 10 volts higher than the output voltage, while, in no-load conditions, the gate voltage Vg may only be 2 volts higher. In this example, the Zener voltage Vz1 would be chosen above 10 volts.

A problem of such an output stage arises in applications where the supply voltage is not regulated. The supply voltage may then unpredictably reach a value close to the breakdown voltage of the components of the amplifier. Although the supply voltage is then still at an acceptable value, the gate voltage Vg of transistor M1 will exceed the supply voltage and cause the destruction of components, for example of transistor M4. Therefore, a large security margin must be taken for the supply voltage, resulting in a power loss of the amplifier.

FIG. 2 shows a conventional solution for reducing the supply voltage security margin. All the elements of FIG. 1A, except for capacitor C, are integrated on the same chip 1. An external circuit 9 is used to limit the voltage applied to bootstrap terminal 5. Capacitor C is no longer connected to bootstrap terminal 5 as in FIG. 1A. Instead, it is connected to supply line +Vcc through a diode D2. The voltage at terminal 5 is set by the emitter of a bipolar transistor T whose collector is connected to a node A between capacitor C and diode D2. The base of transistor T is coupled to ground or to line −Vcc through a Zener diode DZ2 and to the collector of transistor T through a bias resistor R.

With this construction, when the voltage at node A exceeds the Zener voltage Vz2 of diode DZ2, transistor T limits the voltage at terminal 5 to the Zener voltage Vz2. The gate voltage Vg of transistor M1 will therefore always be below Zener voltage Vz2. Zener voltage Vz2 is preferably chosen close to the circuit's breakdown voltage in order to obtain maximum power from the amplifier.

However, the Zener voltage Vz2 varies with variations of process and temperature. This makes it difficult to accurately control the maximum bootstrap voltage, whereby a security margin is still necessary for the supply voltage. This security margin is however smaller than that needed in the circuit of FIG. 1A.

Another drawback of the circuit of FIG. 2 is that the bootstrap capacitor C is practically directly connected to supply line +Vcc, which will cause pop-noise on terminal 6 at power-on. With the construction of FIG. 1A, several measures can be taken to cancel the pop-noise (for example, pulling down the base of transistor Q1 at power-on), but these measures are inoperative with the construction of FIG. 2.

SUMMARY OF THE INVENTION

An object of the present invention is to provide a bootstrapped amplifier stage which reduces the security margin for the supply voltage.

Another object of the present invention is to provide such an amplifier stage wherein pop-noise can be cancelled.

In order to achieve these objects, the present invention provides an amplifier output stage having an output transistor connected to a high supply voltage and a bootstrap terminal coupled to a control terminal of the output transistor through control means, the stage including a capacitor arranged between the bootstrap terminal and the output of the stage for elevating the voltage at the bootstrap terminal above the high supply voltage, and means for limiting the voltage at the bootstrap terminal to a predetermined threshold, wherein the means for limiting directly acts on the control terminal of the output transistor to reduce the conductivity of the output transistor when the voltage at the bootstrap terminal exceeds the threshold.

According to an embodiment of the present invention, the means for limiting the voltage at the bootstrap terminal includes a dividing bridge connected between the bootstrap terminal and a low supply voltage, and a transistor driven by the output of the dividing bridge and coupled between the control terminal of the output transistor and the low supply voltage.

According to an embodiment of the present invention, said transistor driven by the output of the dividing bridge is coupled to the low supply voltage through a source of a reference voltage.

BRIEF DESCRIPTION OF THE DRAWINGS

The foregoing and other objects, features and advantages of the present invention will be readily understood and apparent from the following detailed description of a preferred, non-limiting, embodiment of the present invention described by way of example with reference to the accompanying drawings, in which.

For sake of clarity, the same elements are designated by the same reference characters in the different figures. Moreover, only those elements which are necessary for understanding the invention have been shown in the figures.

DETAILED DESCRIPTION

According to an embodiment of the present invention, the voltage between the bootstrap terminal of an amplifier and the negative supply terminal is detected for limiting the gate voltage of the high-side output transistor of the amplifier.

Figure 3:
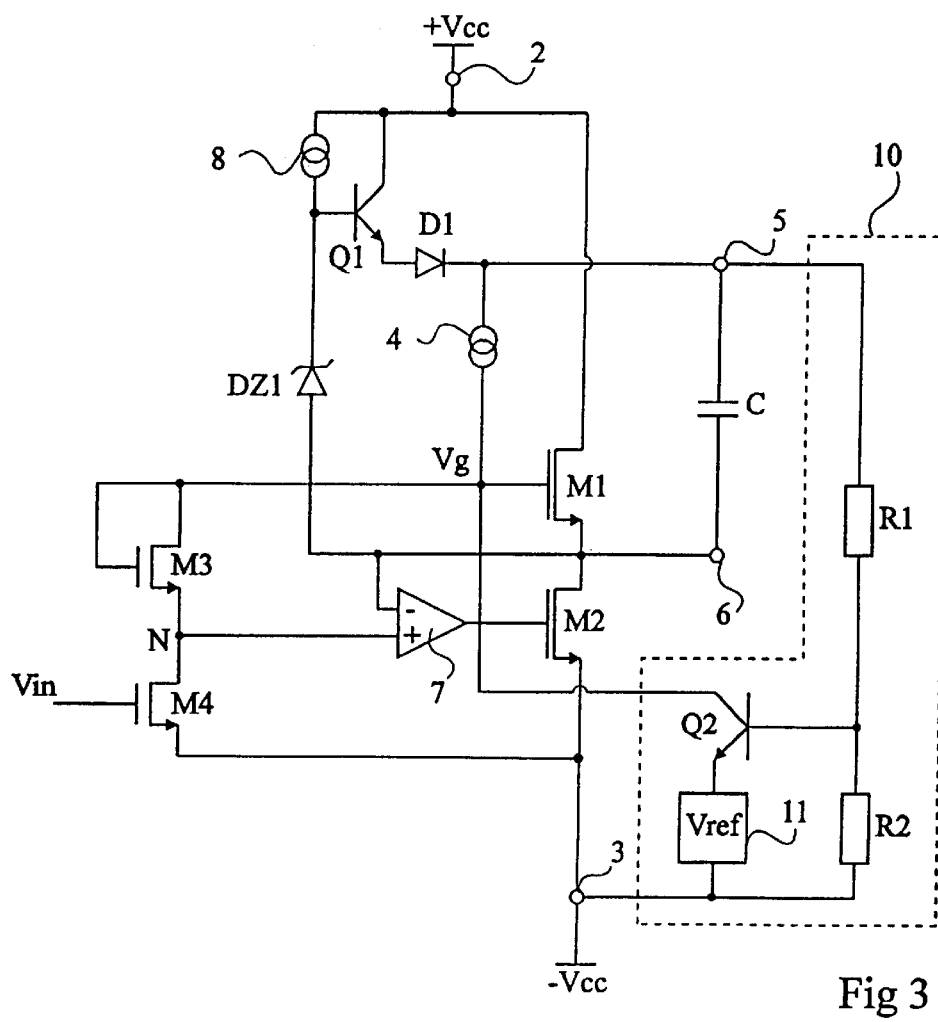
FIG. 3 shows an output stage of an amplifier with a clamping circuit according to an embodiment of the present invention.

This solution is illustrated in FIG. 3 which shows an output stage of a power amplifier associated with a clamping circuit according to an embodiment of the present invention. In FIG. 3, only the output stage of the amplifier has been shown. This output stage is similar to that of FIG. 1A.

A feature of the present invention is that the gate of the high-side transistor M1 is associated with a clamping circuit 10 comprising a bipolar transistor Q2, a reference voltage source 11, and a dividing bridge including resistors R1 and R2 connected in series between the bootstrap terminal 5 and the negative supply terminal 3 (or ground). The collector of transistor Q2 is connected to the gate of transistor M1 and its emitter is coupled to the negative supply terminal 3 (or ground) through source 11. The base of transistor Q2 is connected to the middle point (or output) of the dividing bridge.

Thus, the bootstrap voltage at terminal 5 is continuously compared through the dividing bridge R1, R2 to the constant reference voltage Vref provided by source 11. As soon as the bootstrap voltage exceeds a threshold set by voltage Vref and the dividing bridge, transistor Q2 turns on and the voltage at the gate of transistor M1 decreases, causing a decrease of the voltage at terminal 6, thus of the bootstrap voltage at terminal 5. The bootstrap voltage decreases until transistor Q2 turns off again. Therefore, the gate voltage Vg of transistor M1 is regulated to a value such that the bootstrap voltage remains equal to the threshold set by reference voltage Vref and the dividing bridge R1, R2. This threshold, equal to voltage Vref divided by the ratio of bridge R1, R2, is set to the desired value by appropriately selecting the values of resistors R1 and R2, according to voltage Vref.

The reference voltage source 11 will be accurate and temperature compensated to make the regulation of the bootstrap voltage particularly efficient, whereby the security margin for the supply voltage may be reduced. It is possible, in the invention, to use an accurate reference source, such as a band-gap reference source, because the reference voltage Vref may have any low value.

Figure 1A:
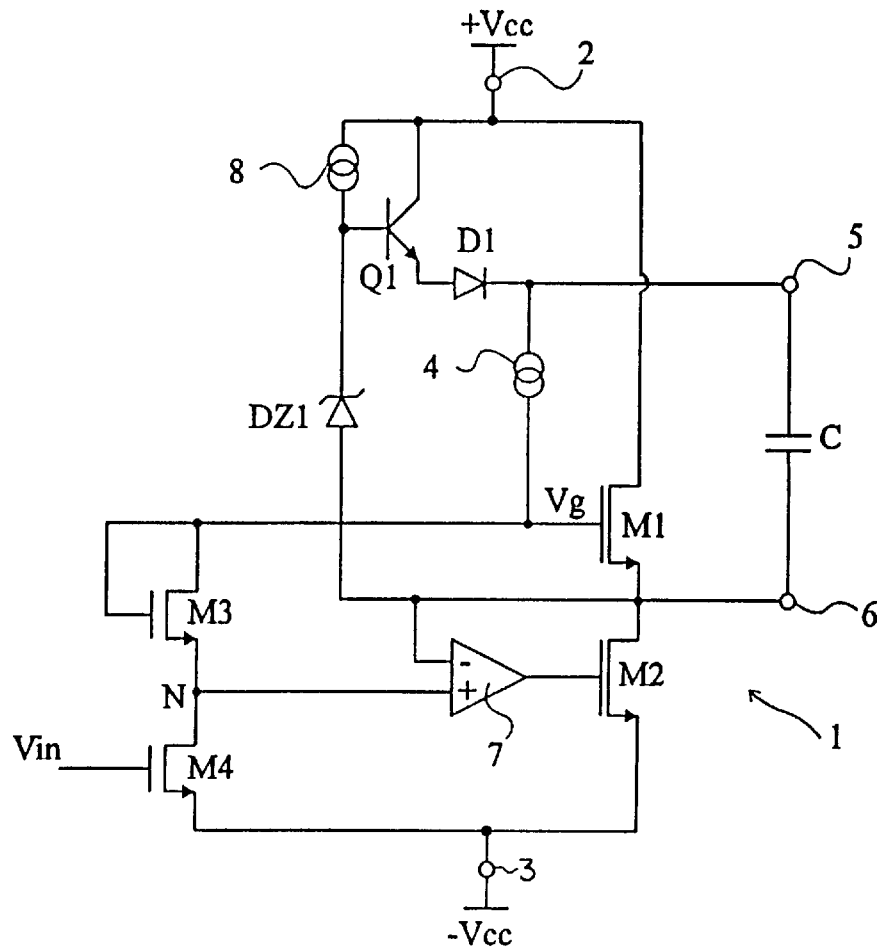
FIG. 1A shows a bootstrapped output stage of a conventional amplifier.
Figure 1B:
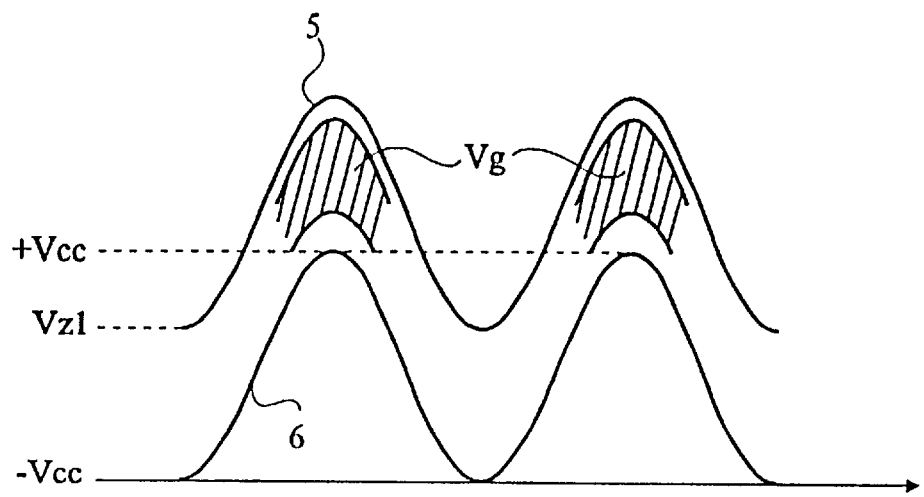
FIG. 1B illustrates the operation of the bootstrapped output stage shown in FIG. 1A.
Figure 2:
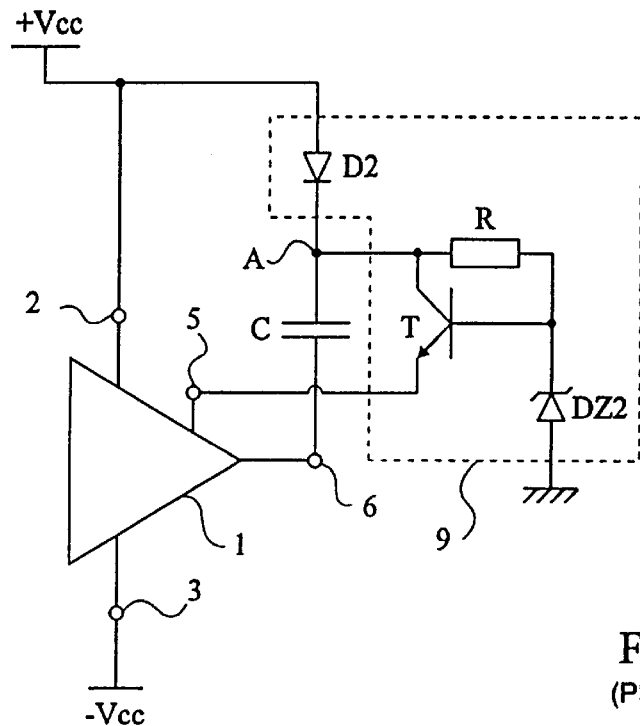
FIG. 2 shows a conventional solution for reducing the supply voltage security margin required in the circuit of FIG. 1A.

With the clamping circuit according to an embodiment of the present invention, the bootstrap capacitor C is connected as in FIG. 1A, whereby any conventional measure for reducing pop-noise can be taken.

When the bootstrap voltage is lower than its threshold, transistor Q2 is off. Thus, the power consumption of the clamping circuit 10 is advantageously limited to those periods where the clamping circuit is active.

Preferably, clamping circuit 10 is integrated with the amplifier. Thus, only capacitor C is a discrete component.

Many alternatives and modifications of the present invention will appear to those skilled in the art. In particular, each of the described components may be replaced by one or several elements achieving the same function. Moreover, the selection of the values of the resistors and of the capacitor and the selection of the components (transistor, current source, voltage source) can be readily carried out by those skilled in the art depending on the desired operating characteristics.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier output stage having an output transistor connected to a high supply voltage and having a bootstrap terminal coupled to a control terminal of the output transistor through control means, the output stage comprising:

a capacitor arranged between the bootstrap terminal and an output of the output stage for elevating a voltage at the bootstrap terminal above the high supply voltage; and means for limiting the voltage at the bootstrap terminal to no greater than a predetermined maximum threshold;

wherein the means for limiting directly acts on the control terminal of the output transistor to reduce a conductivity of the output transistor when the voltage at the bootstrap terminal exceeds the predetermined threshold.

2. The amplifier output stage according to claim 1, wherein the means for limiting the voltage at the bootstrap terminal includes:

a dividing bridge connected between the bootstrap terminal and a low supply voltage; and a transistor driven by an output of the dividing bridge and coupled between the control terminal of the output transistor and the low supply voltage.

3. The amplifier output stage according to claim 2, wherein said transistor driven by the output of the dividing bridge is coupled to the low supply voltage through a source of a reference voltage.

4. A voltage limiting circuit comprising:

a first terminal to receive a first voltage;

a second terminal to receive a second voltage;

a voltage divider coupled between the first terminal and a voltage supply terminal, the voltage divider having an output; and a switch having first, second, and third terminals, the first terminal of the switch being coupled to the second terminal of the circuit, the second terminal of the switch being coupled to the output of the voltage divider, and the third terminal of the switch being coupled to a predetermined reference voltage, the switch comparing the output of the voltage divider to the predetermined reference voltage to limit the second voltage to no greater than a predetermined maximum threshold.

5. The circuit of claim 4, wherein the predetermined reference voltage is provided by a temperature compensated reference voltage source coupled between the third terminal of the switch and the voltage supply terminal.

6. The circuit of claim 4, wherein the switch includes a transistor having a collector that is coupled to the second terminal of the voltage limiting circuit, a base that is coupled to the output of the voltage divider, and an emitter that is coupled to the predetermined reference voltage.

7. The circuit of claim 6, wherein the voltage divider includes first and second resistors coupled in series between the first terminal of the circuit and the voltage supply terminal.

8. The circuit of claim 7, wherein the first terminal of the circuit is coupled to a bootstrap terminal of an output stage, the output stage including an output transistor having a first terminal coupled to a second voltage supply terminal, a second terminal that provides an output of the output stage, and a control terminal, coupled to the second terminal of the circuit, to control the output of the output stage.

9. The circuit of claim 4, wherein the first terminal of the circuit is coupled to a bootstrap terminal of an output stage, the output stage including an output transistor having a first terminal coupled to a second voltage supply terminal, a second terminal that provides an output of the output stage, and a control terminal, coupled to the second terminal of the circuit, to control the output of the output stage.

10. A control circuit for controlling a voltage applied to a control terminal of an output transistor, the control terminal of the output transistor being coupled to a bootstrap terminal to receive a bootstrap voltage, the control circuit comprising:

voltage sensing means, connected to the bootstrap terminal, for sensing a value of the bootstrap voltage; and voltage limiting means, connected to the control terminal of the output transistor and responsive to the voltage sensing means, for limiting the voltage applied to the control terminal to no greater than a predetermined maximum value.

11. The control circuit of claim 10, wherein the voltage limiting means limits the voltage applied to the control terminal by reducing a conductivity of the output transistor.

12. The control circuit of claim 10, wherein the voltage sensing means includes a voltage divider connected between the bootstrap terminal and a supply voltage and having an output that is coupled to the voltage limiting means.

13. The control circuit of claim 12, wherein the voltage limiting means includes:

a bipolar transistor having a collector that is coupled to the control terminal of the output transistor, a base that is coupled to the output of the voltage divider, and an emitter; and a reference voltage source coupled between the emitter of the bipolar transistor and the supply voltage;

wherein the bipolar transistor compares the output of the voltage divider to a value of the reference voltage source to limit the voltage applied to the control terminal to the predetermined value.

14. The control circuit of claim 13, wherein the voltage divider includes first and second resistors connected in series between the bootstrap terminal and the supply voltage, the output of the voltage divider being connected between the first and second resistors; and wherein the predetermined value is equal to the value of the reference voltage source divided by a ratio of resistances of the first and second resistors.

15. The control circuit of claim 13, wherein the reference voltage source is a band gap voltage reference source.

* * * * *

UNITED STATES PATENT AND TRADEMARK OFFICE
CERTIFICATE OF CORRECTION

PATENT NO. : 5,945,877
DATED : August 31, 1999
INVENTOR(S): PakriSwami Elango and Gee-Heng Loh It is certified that error appears in the above-identified patent and that said Letters Patent is hereby corrected as shown below:

On the title page, item [73] should read:

[73] Assignee: SGS-Thomson Microelectronics Pte. Ltd., Singapore

Signed and Sealed this

First Day of February, 2000

Attest:

Q. TODD DICKINSON

Attesting Officer

Acting Commissioner of Patents and Trademarks